United States Patent
Lee

(10) Patent No.: US 8,184,485 B2
(45) Date of Patent: May 22, 2012

(54) SEMICONDUCTOR DEVICE HAVING COUPLING ELIMINATION CIRCUIT

(75) Inventor: Chang-Soo Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 715 days.

(21) Appl. No.: 12/318,581

(22) Filed: Dec. 31, 2008

(65) Prior Publication Data
US 2009/0172465 A1 Jul. 2, 2009

(30) Foreign Application Priority Data
Jan. 2, 2008 (KR) .................. 10-2008-0000015

(51) Int. Cl.
*G11C 11/34* (2006.01)
(52) U.S. Cl. .......... 365/185.23; 365/185.11; 365/230.03
(58) Field of Classification Search ............. 365/185.23, 365/185.11, 230.03, 230.06, 230.02, 200, 365/191; 327/525, 526, 565, 595
See application file for complete search history.

(56) References Cited

U.S. PATENT DOCUMENTS

| 5,966,335 A | 10/1999 | Nozaki | |
|---|---|---|---|
| 6,137,157 A | 10/2000 | Proebsting | |
| 6,243,301 B1 * | 6/2001 | Agata et al. | 365/189.02 |
| 6,362,643 B1 * | 3/2002 | Kim | 324/760.02 |
| 7,924,638 B2 * | 4/2011 | Gajjewar et al. | 365/200 |
| 2007/0216634 A1 * | 9/2007 | Kim et al. | 345/100 |

FOREIGN PATENT DOCUMENTS
KR 10-0466937 B1 1/2005
* cited by examiner

*Primary Examiner* — Dang Nguyen
(74) *Attorney, Agent, or Firm* — Lee & Morse, P.C.

(57) ABSTRACT

A semiconductor device including a plurality of repairable signal lines, the device including a first driver adapted to maintain a first portion of each defective one of the repairable signal lines at a first voltage level, and a second driver adapted to drive a second portion of each of the defective ones of the repairable signal lines being repaired to the first voltage level.

17 Claims, 7 Drawing Sheets

SEMICONDUCTOR DEVICE HAVING COUPLING ELIMINATION CIRCUIT

BACKGROUND

1. Technical Field

Embodiments relate to semiconductor devices. More particularly, embodiments relate to a semiconductor device and a floating prevention method thereof, which may prevent a portion of signal line from floating when a signal line is an open state.

2. Description of the Related Art

Semiconductor devices, e.g., DRAM, etc., generally employ a redundancy scheme for replacing a defective memory cell with a spare memory cell.

For efficiency, in the redundancy scheme, a replacement may be obtained in a unit of a column selection line or a normal word line enable signal. For example, when a defective column selection line is replaced with a spare column selection line, the defective column selection line is maintained at a ground level.

However, e.g., when a line open state occurs in a defective column selection line, a portion of the defective column selection line may be in a floating state. Thus, electrical coupling with an adjacent column selection line may occur.

SUMMARY

Embodiments are therefore directed to a semiconductor device and a floating prevention method thereof, which substantially overcome one or more of the problems due to the limitations and disadvantages of the related art.

It is therefore a feature of an embodiment to provide a semiconductor device that is adapted to prevent a portion of a signal line from floating when an open occurs in the signal line such that the signal line may be maintained at a predetermined voltage level.

It is therefore a separate feature of an embodiment to provide a floating prevention method for a semiconductor device that is adapted to prevent a portion of a signal line from floating when an open occurs in the signal line by maintaining the portion at a predetermined voltage level.

It is therefore a separate feature of an embodiment to provide a semiconductor memory device adapted to maintain a ground level in a defective signal line, e.g., defective column selection line, defective normal word line enable signal line, etc., which may be result of an open therein, while repairing the defective signal line using a spare signal line.

At least one of the above and/or other features of an embodiment may be realized by providing a semiconductor device including a plurality of repairable signal lines, the device including a first driver adapted to maintain a first portion of each defective one of the repairable signal lines at a first voltage level, and a second driver adapted to drive a second portion of each of the defective ones of the repairable signal lines being repaired to the first voltage level.

The first driver may be connected to a first end of each of the repairable signal lines and the second driver may be connected to a second end of each of the repairable signal lines, the first end may be opposite to the second end of the respective repairable signal line.

The device may include a plurality of spare signal lines, wherein each of the defective ones of the repairable signal lines being repaired may be repaired by a respective one of the spare signal lines.

An open circuit state may exist along the defective one of the repairable signal lines.

The second driver may include a fuse and a transistor device.

The second driver may include a master fuse, and a respective line fuse and a respective transistor device between each of the repairable signal lines and the master fuse and between each of the spare signal lines and the master fuse.

To repair the defective one of the repairable signal lines, the master fuse may be cut, the respective line fuse of effective ones of the repairable signal lines may be cut, and the respective line fuse of the spare signal line being employed to repair the defective one of the repairable signal lines may be cut.

The signal line may be a column selection line and the spare signal line may be a spare column selection line.

The signal line may be a normal word line enable signal line and the spare signal line may be a spare normal word line enable signal line.

The first voltage level may be a ground voltage level.

The first driver may include an inverter driver and, for the defective ones of the repairable signal lines being repaired, an input to a respective inverter of the inverter driver may be electrically connected to a power source having the first voltage level.

The semiconductor device may be a semiconductor memory device.

At least one of the above and/or other features of an embodiment may be realized by separately providing a semiconductor device including a plurality of repairable signal lines, the device including a first voltage level maintaining unit for maintaining a first portion of each defective one of the repairable signal lines at a first voltage level, and a driving unit for driving a second portion of each of the defective ones of the repairable signal lines being repaired to the first voltage level.

The first voltage level maintaining unit may be connected to a first end of each of the repairable signal lines and the driving unit may be connected to a second end of each of the repairable signal lines, the first end being opposite to the second end of the respective repairable signal line.

The device may further include a plurality of spare signal lines, wherein each of the defective ones of the repairable signal lines being repaired may be repaired by a respective one of the spare signal lines.

An open circuit state may exist along the defective one of the repairable signal lines.

The driving unit may include a fuse and a transistor device.

The driving unit may include a master fuse, and a respective fuse and a respective transistor device between each of the repairable signal lines and the master fuse and between each of the spare signal lines and the master fuse.

At least one of the above and/or other features of an embodiment may be separately realized by providing a method for preventing a signal line from floating in a semiconductor device including a plurality of repairable signal lines, the method including maintaining a first portion of each defective one of the repairable signal lines at a first voltage level, and driving a second portion of each of the defective ones of the repairable signal lines being repaired to the first voltage level to prevent the second portion of the repairable signal line from floating.

The semiconductor device may include a plurality of spare signal lines, a master fuse, a plurality of line fuses and a plurality of transistors, and driving the second portion may include cutting the master fuse, cutting the line fuse associated with each effective one of the repairable signal lines, and cutting the line fuse associated with the spare signal lines employed to repair the defective ones of the repairable signal lines.

BRIEF DESCRIPTION OF THE DRAWINGS

The above and other features and advantages of embodiments will become more apparent to those of ordinary skill in the art by describing in detail exemplary embodiments thereof with reference to the attached drawings, in which.

DETAILED DESCRIPTION OF THE EMBODIMENTS

Figure 1:
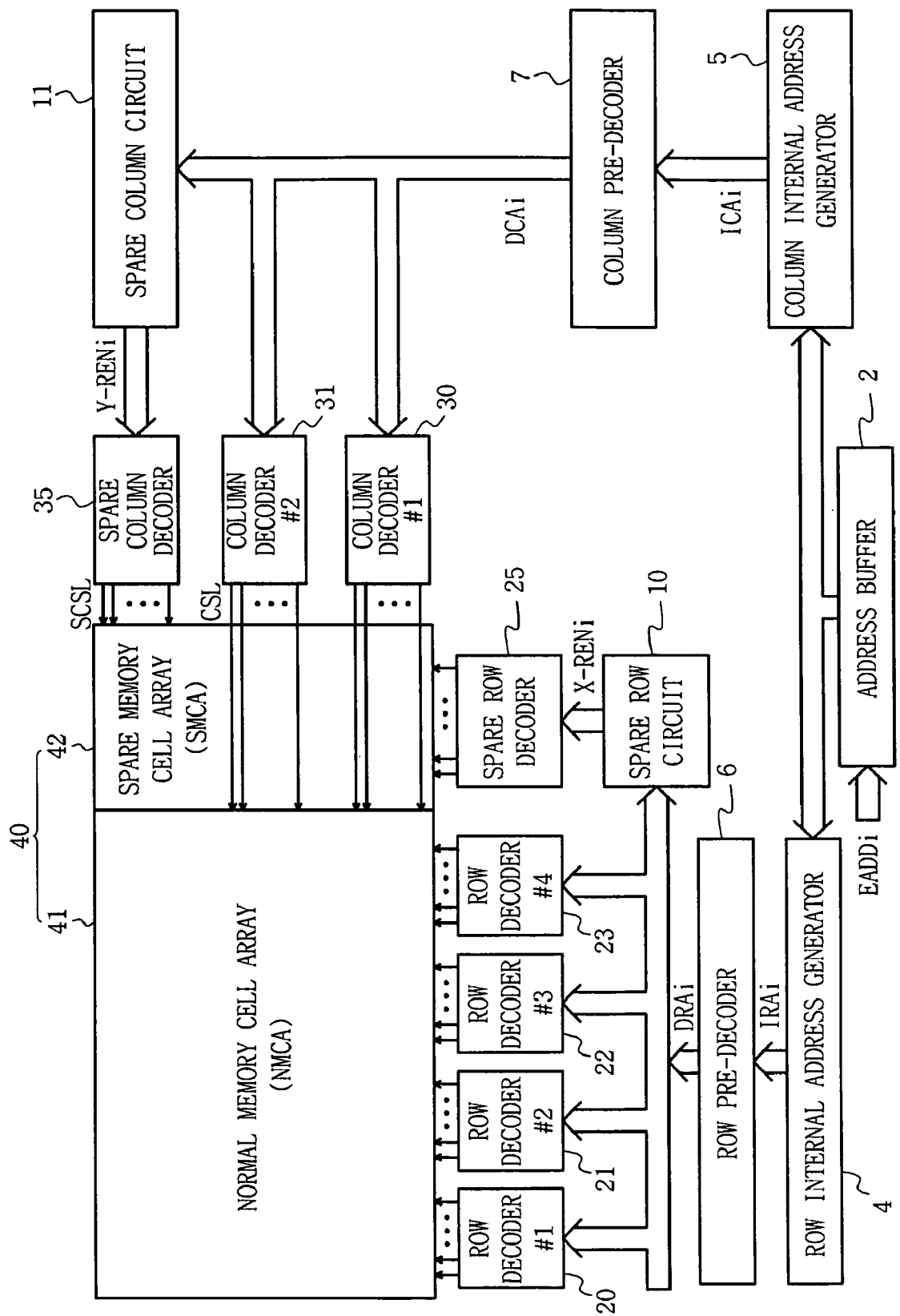
FIG. 1 illustrates a block diagram of a semiconductor memory device including a redundancy scheme.

Korean Patent Application No. 10-2008-0000015, filed on Jan. 2, 2008, in the Korean Intellectual Property Office, and entitled: "Semiconductor Device Having Coupling Elimination Circuit," is incorporated by reference herein in its entirety.

Unless otherwise defined, all terms (including technical and scientific terms) used herein have the same meaning as commonly understood in the art to which embodiments belong. It will be further understood that terms used herein should be interpreted as having a meaning that is consistent with their meaning in the context of this specification and the relevant art and will not be interpreted in an idealized or overly formal sense unless expressly so defined herein. Exemplary embodiments of are more fully described below with reference to the accompanying drawings. Aspects, however, may be embodied in many different forms and should not be construed as being limited to the exemplary embodiments set forth herein; rather, these exemplary embodiments are provided so that this disclosure is thorough and complete, and conveys aspects of embodiments to those skilled in the art. For clarity, a detailed description of other examples, general random access memories and circuits has been omitted. It will also be understood that when an element is referred to as being "between" two elements, it can be the only element between the two elements, or one or more intervening elements may also be present. Like reference numerals refer to like elements throughout the specification.

FIG. 1 illustrates a block diagram of a general semiconductor memory device including a redundancy scheme. The semiconductor device may include a memory cell array 40, a plurality of row decoders 20, 21, 22, 23, a plurality of column decoders 30, 31, a spare row decoder 25, a spare row circuit 10, a spare column decoder 35, a row pre-decoder 6, a row internal address generator 4, an address buffer 2, a spare column circuit 11, a column pre-decoder 7, and a column internal address generator 5.

Referring to FIG. 1, the memory cell array 40 may include a normal memory cell array 41 and a spare memory cell array 42. The memory cell array 40 and/or the spare memory cell array 42 may be coupled with respective ones of the plurality of column decoders 30, 31 and 35. More particularly, e.g., the row decoders 20, 21, 22 and 23 and the column decoders 30 and 31 may be used to designate respective rows and columns of the normal memory cell array 41. The spare row decoder 25 and the spare column decoder 35 may be used to designate respective redundancy rows and redundancy columns for the spare memory cell array 42.

In FIG. 1, a redundancy program may be realized with the spare row circuit 10 and the spare column circuit 11 functioning as a redundancy program circuit. The spare row circuit 10 may receive a pre-decoded row address DRAi of a row pre-decoder 6, may generate a row redundancy enable signal X-RENi, and may apply the row redundancy enable signal X-RENi to the spare row decoder 25. The spare row circuit 10 may thereby repair a row directional defect. The spare column circuit 11 may receive a pre-decoded column address DCAi of a column pre-decoder 7, may generate a column redundancy enable signal Y-RENi, and may apply the column redundancy enable signal Y-RENi to the spare column decoder 35. The spare column circuit 11 may thereby repair a column directional defect.

For example, when an external address EADDi of 7 bits is applied to the address buffer 2, the row internal address generator 4 and the column internal address generator 5 may generate a signal of applied respective bits and a compensation signal inversed from a logic state of respective bits. The row internal address generator 4 may generate internal addresses IRAi. The column internal address generator 5 may generate internal addresses ICAi. In embodiments in which the external address EADDi includes, e.g., 7 bits, the internal addresses IRAi, ICAi may each include, e.g., 14 bits. Internal addresses of a desired bit number may be generated by combining together bits from the row and column internal address generators 4 and 5. The row pre-decoder 6 may pre-decode the internal address IRAi and may generate a predecoded address DRAi. The column pre-decoder 7 may pre-decode the internal address ICAi and may generate a predecoded address DCAi.

The row decoder 20 may decode the predecoded row address DRAi and may select one of word lines WL0:n (not shown) of the normal memory cell array 41. In response to the predecoded row address DRAi, the spare row circuit 10 may generate a row redundancy enable signal X-RENi for replacing a row including a defective memory cell. The column decoder 30 may decode the predecoded column address DCAi, and may select one of the column selection lines CSL of the normal memory cell array 41. The spare column circuit 11 may generate a column redundancy enable signal Y-RENi for replacing a column including the defective memory cell in response to the predecoded column address DCAi.

Referring to FIG. 1, in the semiconductor memory device, a column selection line CSL that may be coupled to a bit line of a defective memory cell may be replaced with a spare column selection line SCSL. Memory cells coupled to the spare column selection line may operate in place of the defective memory cell.

Figure 2A:
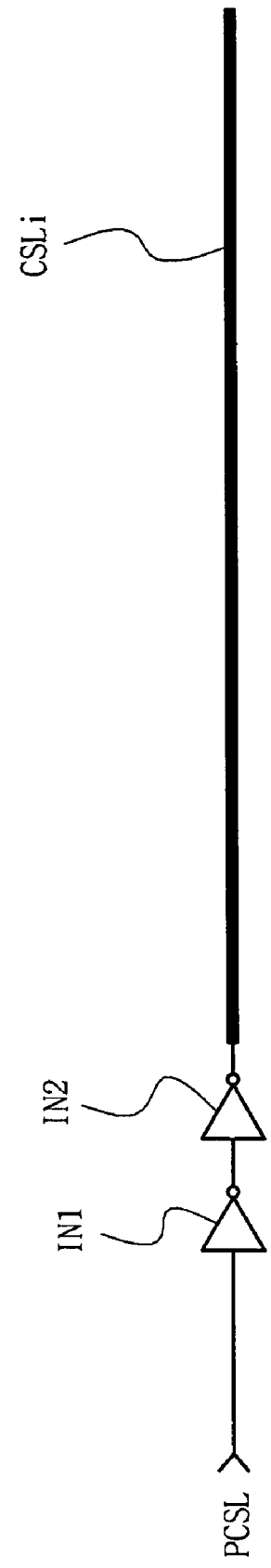
FIG. 2A illustrates a voltage level state of an effective signal line.
Figure 2B:
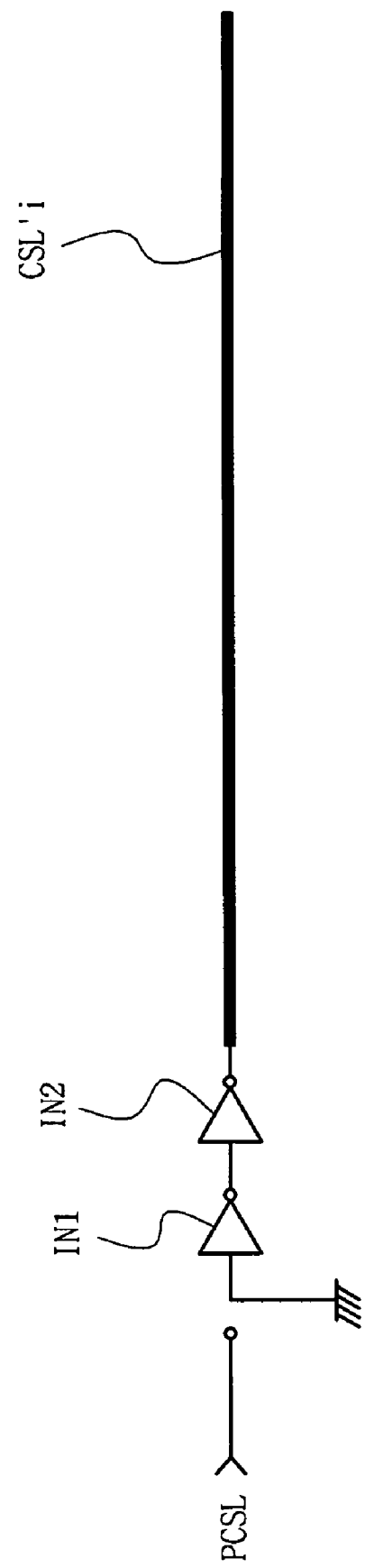
FIG. 2B illustrates a voltage level state of a defective signal line.

When a defective column selection line CSL is replaced with a spare column selection line SCSL, the defective column selection line CSL may be maintained at a ground level, as shown in FIG. 2B.

FIGS. 2A and 2B schematically illustrate a voltage level state of a column selection line CSL in an effective state, i.e., an effective column selection line, and a column selection line CSL' in a defective state that needs to be repaired and/or replaced, i.e., a defective column selection line, respectively. The defective column selection line CSL' of FIG. 2B may be defective due to, e.g., an open circuit, a short circuit, etc.

In general, when a defective column selection line CSL' is replaced with a spare column selection line SCSL, the defective column selection line CSL' may be maintained at a ground level, as shown in FIG. 2B. More particularly, the defective column section signal line may be maintained and/or driven to a first voltage level, e.g., a ground voltage level, and one of the spare signal lines may be employed instead.

Referring to FIGS. 2A and 2B, the column selection lines CSL, CSL' may be connected to a column selection line signal PCSL. More particularly, a respective column selection line signal PCSL may be coupled to an input of an inverter IN1 along the column selection signal line CSL, CSL'. When it is determined that one or more of the column selection lines CSL, CSL' is defective, the defective column selection line CSL' may no longer be connected and may not receive the respective column selection line signal PCSL. That is, e.g., to repair the defective column selection line CSL', the input of the inverter IN1 along the defective column selection line CSL' may be coupled to a first voltage supply, e.g., ground voltage supply.

Figure 3:
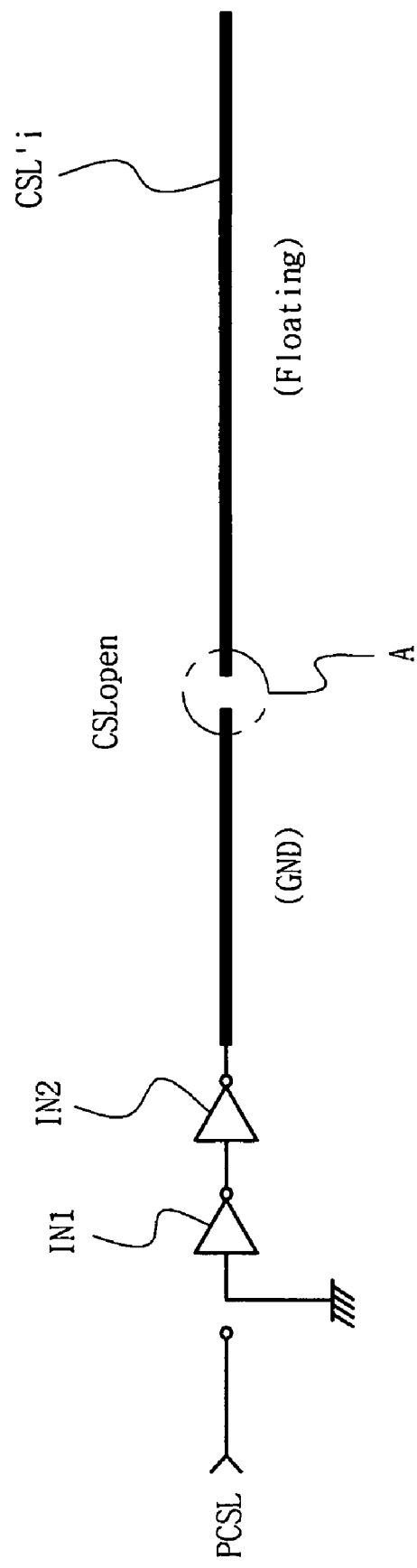
FIG. 3 illustrates the defective signal line of FIG. 2B in a floating state.

More particularly, as shown in FIG. 3, the defective column selection line CSL' of FIG. 2B may be defective because it is experiencing a thinning or open state A. As a result, a portion of the defective column selection line CSL' may be floating. Accordingly, a portion of the defective column selection line CSL', on one side of the thinning or open state A, that is not connected to the inverters IN1, IN2 may be electrically isolated from a portion of the defective column selection line CSL' on another side of the thinning or open state A and may be in a floating state.

As described above, when a signal line, e.g., a column selection line or normal word line enable signal line experiencing an open state remains floating, e.g., is not maintained at a ground level, a serious defect may be caused. For example, an electrical coupling with an adjacent line may occur, which may cause an error in, e.g., a read and/or write operation.

Accordingly, some embodiments may provide semiconductor devices and floating preventing methods adapted to prevent a floating state of a defective signal line when, e.g., an open state occurs in the signal line. For example, in some embodiments, the defective signal line may be maintained at a predetermined voltage level to avoid floating. That is, e.g., some embodiments may provide a device and/or a method adapted to prevent an error in operation that may occur as a result of, e.g., a thinning or open state, by maintaining a defective signal line at a ground voltage level.

Figure 4A:
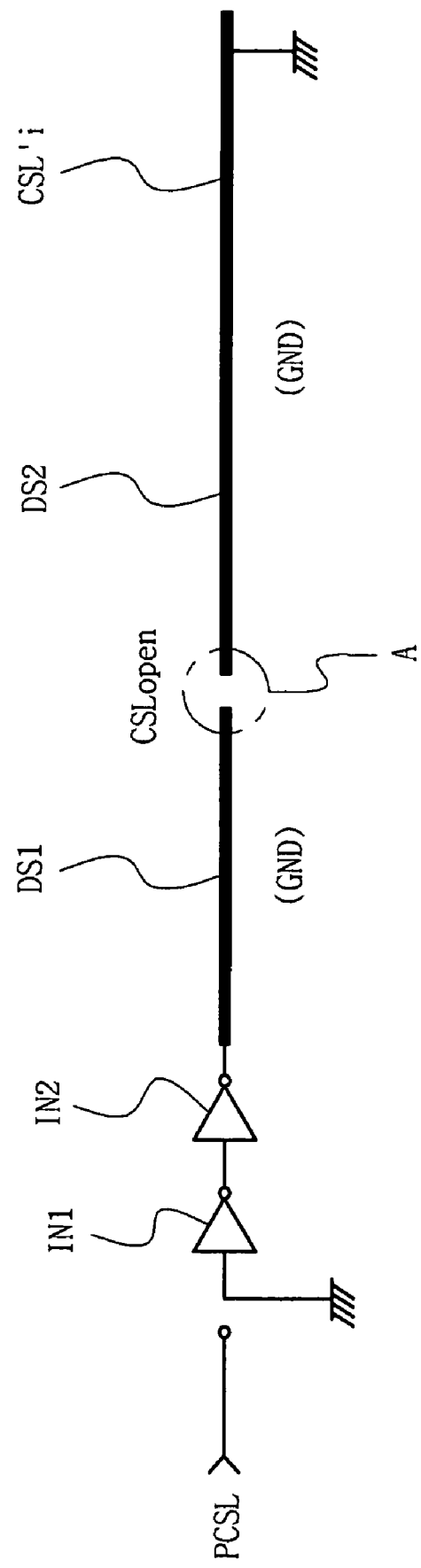
FIG. 4A illustrates an exemplary solution for a floating state of a defective column selection line according to an exemplary embodiment.
Figure 4B:
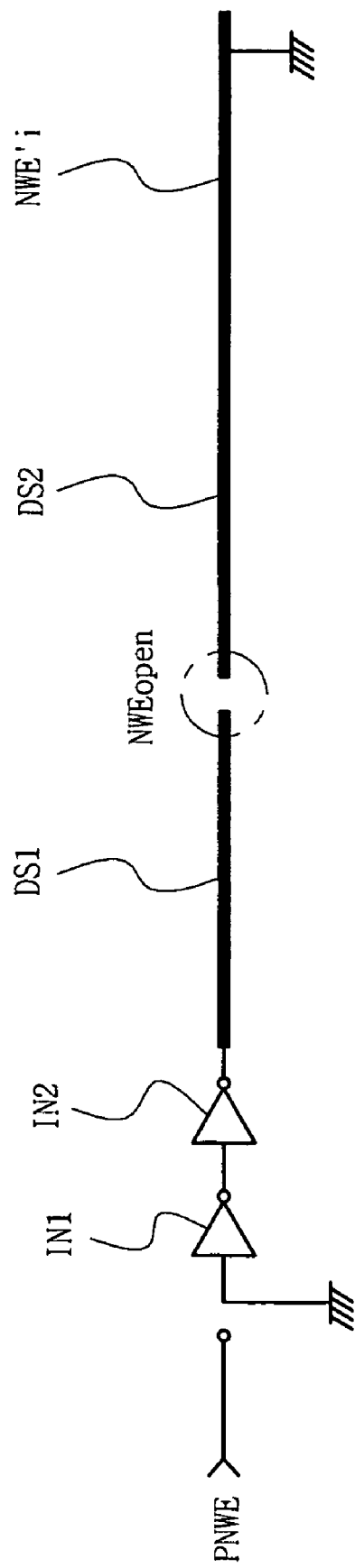
FIG. 4B illustrates an exemplary solution for a floating state of a defective normal word line enable signal line according to an exemplary embodiment.

FIG. 4A illustrates an exemplary solution for a floating state of a defective column selection line CSL' according to an exemplary embodiment. FIG. 4B illustrates an exemplary solution for a floating state of a defective normal word line enable signal line NWE' according to an exemplary embodiment.

As shown in FIG. 4A and 4B, in some embodiments, first portions DS1 of the signal lines CSL', NWE' may be electrically connected to a ground voltage level and second portions DS2 of the signal lines CSL', NWE' may be electrically isolated from the respective first portions DS1. More particularly, the first portions DS1 may be electrically connected to a ground voltage level via a respective driver (IN1, IN2) and, thus, may be maintained at a ground level irrespective of the open state to prevent floating. In some embodiments, floating may be prevented by driving the second portion DS2 of the respective signal line to a ground voltage level. In some embodiments, a semiconductor device may include a driver.

Figure 5:
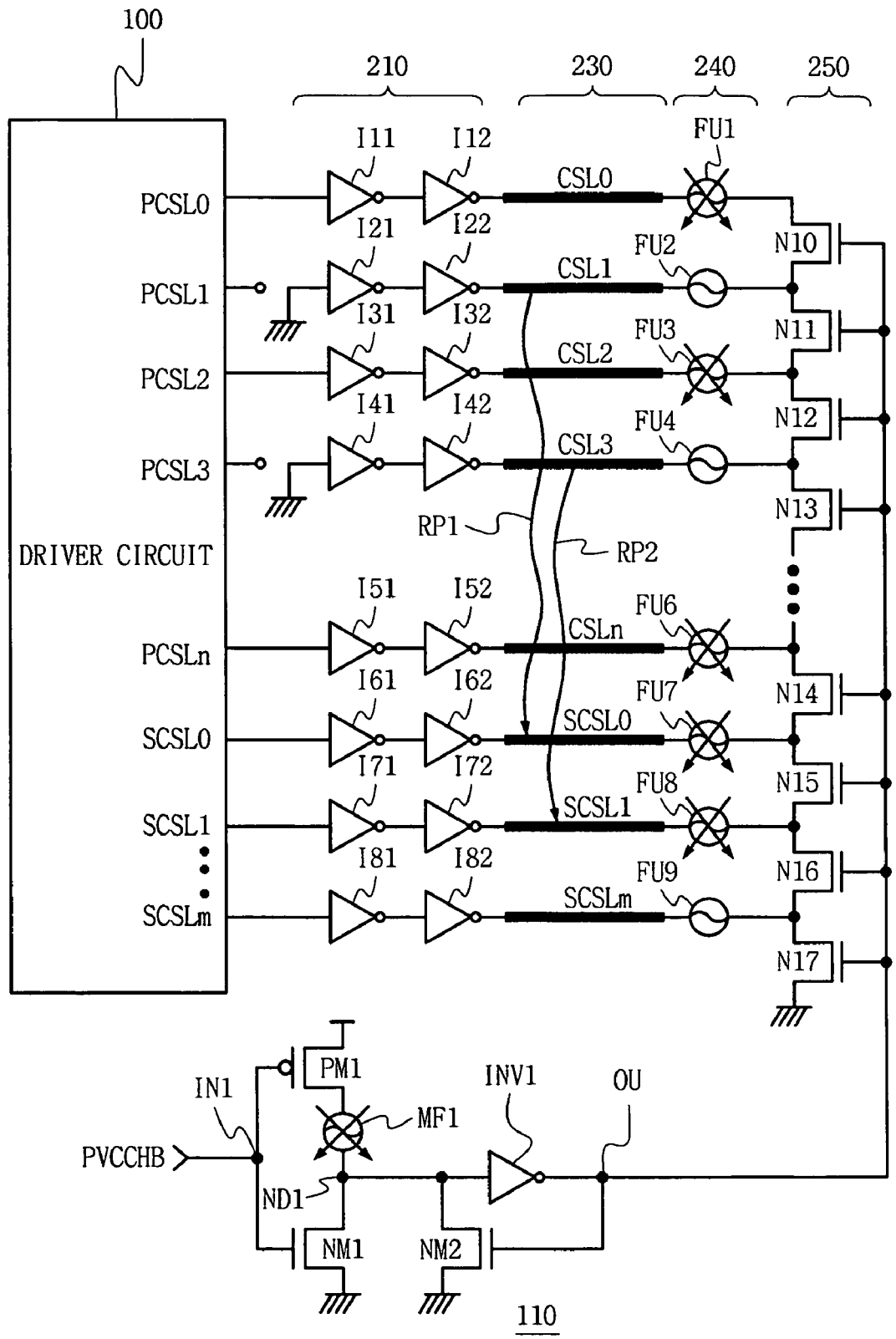
FIG. 5 illustrates an exemplary driver employable to achieve the exemplary voltage states of FIGS. 4A and 4B.

FIG. 5 illustrates an exemplary driver circuit employable to achieve the exemplary voltage states of FIGS. 4A and 4B.

Referring to FIG. 5, the driver may include a driver circuit 100 and an inverter drive unit 210. The driver circuit 100 and the inverter drive unit 210 may function as a first drive unit. A second drive unit may include a line connection fuse unit 240, a transistor unit 250 and a master fuse unit 110. The first drive unit may be connected to one side of signal lines 230 and the second drive unit may be connected to another side, e.g., opposite end, of the signal lines 230.

The first drive unit may be adapted so that the signal line may be maintained at a first voltage level, e.g., ground voltage level, when the signal line is repaired by a spare signal line. The second drive unit may be adapted to maintain a portion of defective ones of the signal lines 230 at the first voltage level, e.g., ground level, when defective state, e.g., an open occurs, in the signal line. The second drive unit, which may be disposed opposite to first drive unit 100 relative to the signal lines 230, may drive a portion of the defective ones of the signal lines 230 to the first voltage level.

The signal lines 230 may be respectively to line connection fuses, e.g., FU1 to FU9.

The master fuse unit 110 may include a PMOS transistor PM1, an NMOS transistor NM1, a fuse MF1, an inverter INV1 and another NMOS transistor NM2. A power up signal PVCCHB may be applied to a gate of each of the PMOS transistor PM1 and the NMOS transistor NM1. The fuse MF1 may be connected between a drain of the PMOS transistor PM1 and a drain of NMOS transistor NM1. The NMOS transistor NM2 may be connected between a drain of the NMOS transistor NM1 and a ground voltage source. The inverter INV1 may be connected between a node ND1 and an output node OU.

In the exemplary device of FIG. 5, at least respective first portions of defective ones of the column selection signal lines 230 may be maintained at a ground level voltage as a result of the driver circuit 100. While the exemplary device of FIG. 5 illustrates column selection signal lines 230, embodiments are not limited thereto. For example, the signal lines 230 may include normal word line enable signal lines NWE. The driver circuit 100 may supply column selection line signals, e.g., PCSL0 to PCSLn and SCSL0 to SCSLm, to the column selection signal lines CSL0 to CSLn and spare column selection signal lines SCSL0 to SCSLm of the signal lines 230, respectively. Further, respective second portions of the defective ones of the signal lines 230 may be driven to the ground voltage level via the master fuse unit 110, the respective line connection fuses, e.g., FU1 to FU9, and/or respective transistors, e.g., N1 to N17.

More particularly, in some embodiments, to repair defective ones of the column selection signal lines CSL0 to CSLn one of the plurality of spare column selection signal lines SCSL0 to SCSLm may be respectively employed instead of each of the defective ones of the column selection signal lines CSL0 to CSLn and first and second portions of the defective column selection signal lines may be maintained at a ground voltage level.

Referring to FIG. 5, it is assumed that the second and third column selection signal lines CSL1 and CSL3 are defective. To repair the second and third column selection signal lines CSL1 and CSL3, the first and second spare column selection lines SCSL0 and SCSL1 may be employed instead of the defective second and third column selection signal lines CSL1 and CSL3. First portions of the second and third column selection signal lines CSL1 and CSL3 may be connected to ground via a ground voltage level input to respective inverters of the inverter drive circuit 210. Respective line connection fuses FU2 and FU4 connected to second portions of the defective second and third column selection signal lines CSL1 and CSL3 may maintain a connection state to electrically connect the respective second portions to the transistor unit 250 and/or the master fuse unit 110 in order to prevent a floating state.

More particularly, referring to FIG. 5, in some embodiments, fuse cutting may be performed as follows. In some embodiments, the respective ones of the line connection fuses FU1 to FU9 connected to the first and third repairable signal lines CSL1 and CSL3 and the respective ones of the line connection fuses FU9 connected to unused ones of the spare column selection lines, e.g. SCSLm, may be maintained, i.e., not cut. The respective ones of the line connection fuses connected to effective ones of the repairable lines, e.g., CSL0, CSL2, CSLn, and to used ones of the spare column selection lines SCSL0 and SCSL1 may be cut, i.e., the spare column selection signal lines being employed to repair the defective column selection line. Further, the master fuse MF1 may be cut.

More particularly, by cutting the master fuse MF1, an output OU of the master fuse unit 100 may have a high level. In the exemplary embodiment of FIG. 5, when the output OU has a high level, transistors N10 to N17 may be turned on. Accordingly, in some embodiments, the second portions of the defective column selection lines, e.g., CSL1 and CSL3, may be electrically connected to a ground voltage level and a floating state thereof may be prevented. Further, a coupling effect with adjacent signal lines may be eliminated.

Semiconductor devices to which aspects of embodiments described herein may be applied include, e.g., a volatile semiconductor memory device such as DRAM, a nonvolatile semiconductor memory device such as flash memory, etc.

It will be apparent to those skilled in the art that modifications and variations can be made without deviating from the spirit or scope of the embodiments. Thus, it is intended that embodiments cover any such modifications and variations, provided they come within the scope of the appended claims and their equivalents. For example, the configuration of fuse and transistor and the cutting method may be varied diversely. Accordingly, these and other changes and modifications are seen to be within the true spirit and scope of the embodiments as defined by the appended claims.

What is claimed is:

1. A semiconductor device including a plurality of repairable signal lines, the device comprising:
    a first driver adapted to maintain a first portion of each defective one of the repairable signal lines at a first voltage level;
    a second driver adapted to drive a second portion of each of the defective ones of the repairable signal lines being repaired to the first voltage level; and
    a plurality of spare signal lines, wherein each of the defective ones of the repairable signal lines being repaired is repaired by a respective one of the spare signal lines.

2. The semiconductor device as claimed in claim 1, wherein the first driver is connected to a first end of each of the repairable signal lines and the second driver is connected to a second end of each of the repairable signal lines, the first end being opposite to the second end of the respective repairable signal line.

3. The semiconductor device as claimed in claim 1, wherein an open circuit state exists along the defective one of the repairable signal lines.

4. The semiconductor device as claimed in claim 1, wherein the second driver includes a fuse and a transistor device.

5. The semiconductor device as claimed in claim 1, wherein the second driver includes a master fuse, and a respective line fuse and a respective transistor device between each of the repairable signal lines and the master fuse and between each of the spare signal lines and the master fuse.

6. The semiconductor device as claimed in claim 5, wherein to repair the defective one of the repairable signal lines, the master fuse is cut, the respective line fuse of effective ones of the repairable signal lines is cut, and the respective line fuse of the spare signal line being employed to repair the defective one of the repairable signal lines is cut.

7. The device as claimed in claim 5, wherein the defective repairable signal line is a column selection line and the spare signal line is a spare column selection line.

8. The device as claimed in claim 5, wherein the defective repairable signal line is a normal word line enable signal line and the spare signal line is a spare normal word line enable signal line.

9. The device as claimed in claim 1, wherein the first voltage level is a ground voltage level.

10. The device as claimed in claim 1, wherein the first driver includes an inverter driver and, for the defective ones of the repairable signal lines being repaired, an input to a respective inverter of the inverter driver is electrically connected to a power source having the first voltage level.

11. The semiconductor device as claimed in claim 1, wherein the semiconductor device is a semiconductor memory device.

12. A semiconductor device including a plurality of repairable signal lines, the device comprising:
    first voltage level maintaining means for maintaining a first portion of each defective one of the repairable signal lines at a first voltage level;
    driving means for driving a second portion of each of the defective ones of the repairable signal lines being repaired to the first voltage level; and
    a plurality of spare signal lines, wherein each of the defective ones of the repairable signal lines being repaired is repaired by a respective one of the spare signal lines.

13. The semiconductor device as claimed in claim 12, wherein the first voltage level maintaining means is connected to a first end of each of the repairable signal lines and the driving means is connected to a second end of each of the repairable signal lines, the first end being opposite to the second end of the respective repairable signal line.

14. The semiconductor device as claimed in claim 12, wherein an open circuit state exists along the defective one of the repairable signal lines.

15. The semiconductor device as claimed in claim 12, wherein the driving means includes a fuse and a transistor device.

16. The semiconductor device as claimed in claim 12 wherein the driving means includes a master fuse, and a respective fuse and a respective transistor device between each of the repairable signal lines and the master fuse and between each of the spare signal lines and the master fuse.

17. A method for preventing a signal line from floating in a semiconductor device including a plurality of repairable signal lines, the method comprising:
    maintaining a first portion of each defective one of the repairable signal lines at a first voltage level; and
    driving a second portion of each of the defective ones of the repairable signal lines being repaired to the first voltage level to prevent the second portion of the repairable signal line from floating, wherein the semiconductor device includes a plurality of spare signal lines, a master fuse, a plurality of line fuses and a plurality of transistors, and wherein driving the second portion includes:
    cutting the master fuse
    cutting the line fuse associated with each effective one of the repairable signal lines; and
    cutting the line fuse associated with the spare signal lines employed to repair the defective ones of the repairable signal lines.

* * * * *